United States Patent
Zu

(10) Patent No.: US 6,177,732 B1
(45) Date of Patent: Jan. 23, 2001

(54) MULTI-LAYER ORGANIC LAND GRID ARRAY TO MINIMIZE VIA INDUCTANCE

(75) Inventor: Longqiang Zu, Phoenix, AZ (US)

(73) Assignee: Intel Corporation, Santa Clara, CA (US)

(*) Notice: Under 35 U.S.C. 154(b), the term of this patent shall be extended for 0 days.

(21) Appl. No.: 09/322,069

(22) Filed: May 27, 1999

(51) Int. Cl.[7] .......................... H01L 23/48; H01L 23/52; H01L 29/40

(52) U.S. Cl. .......................... 257/781; 257/40; 257/776; 257/531

(58) Field of Search .................. 257/40, 775, 777, 257/776, 781, 531

(56) References Cited

U.S. PATENT DOCUMENTS 5,953,623 * 9/1999 Boyko et al. .................. 438/612

\* cited by examiner

Primary Examiner—Terry D. Cunningham
Assistant Examiner—Quan Tra
(74) Attorney, Agent, or Firm—Blakely, Sokoloff, Taylor & Zafman LLP

(57) ABSTRACT

The present invention is a method and apparatus to minimize via inductance in a multi-layer organic land grid array (OLGA) packaging. A plurality of layers are staggered vertically. The plurality of layers include first and second layers which have first and second metal strip connections, respectively. The second layer is above the first layer. The first metal strip connection is aligned with the second metal strip connection to maximize mutual inductance between the first and second layers.

15 Claims, 4 Drawing Sheets

MULTI-LAYER ORGANIC LAND GRID ARRAY TO MINIMIZE VIA INDUCTANCE

BACKGROUND

1. Field of the Invention

This invention relates to integrated circuit (IC) packaging. In particular, the invention relates to multi-layered organic land grid array (OLGA).

2. Description of Related Art

As demand for high performance integrated circuits (IC's) grow, IC packaging becomes more and more important. Once an IC has been fabricated, it is placed inside an IC package. The circuits within the IC are electrically and mechanically coupled to interconnects to leads on the external surface of the package. An IC package not only protects the IC from damage but also provides power, interconnections for input/output (I/O), and heat removal. The considerations for a suitable operating environment includes signal propagation delays. The propagation delays are affected by the overall inductance. In the manufacture of IC packaging, especially for high performance processors, there are two competing requirements: wiring densities and low inductance. It is desirable to achieve greatest wiring densities while at the same time forming interconnections between adjacent layers that provide as low inductance as possible. The formation of high quality via holes, or vias, that are used for interconnections, is an important step in forming high quality interconnections.

The requirements for suitable operating environment due to the complexity of modern processors lead to the introduction of a number of packing technologies. Among these new packaging technologies, grid array packaging has become more and more popular. Examples of these grid array packaging includes pin grid array (PGA), ball grid array (BGA), and land grid array (LGA).

The LGA is essentially a leadless package having dense connection pads in a pitch matrix array, which reduces propagation delays and other environmental effects. There are two types of LGA: plastic LGA (PLGA) and organic LGA (OLGA). The OLGA includes organic material mixed with copper which provides better thermal expansion than the PLGA and is suitable for high density and high performance microprocessors. To accommodate the complexity of modern processors, the circuitry is typically packaged in a multi-layer configuration where a number of layers is placement of circuit elements. A multi-layer package provides a small footprint for the resulting device and reduce propagation delays due to short interconnection lengths. However, a multi-layer design also presents difficulties in formation of vias.

In designing a multi-layer OLGA package, vertical connections between layers are implemented using staggered vias. A staggered vias design is preferred to a stacked vias design because stacked vias are not manufacturable for OLGA.

FIG. 1 shows a prior art spiral via design 100 in a cross-sectional view on the XZ plane and a top view in the XY plane. For illustration purposes, eight layers are shown. There are no metal layers on the top and bottom layers. Vias are connected to a C4 bump and the BGA balls directly.

The cross-sectional view in the XZ plane shows vertical connections 110, 120, 130, 140, 150, 160 and 170, connecting to layers 115, 125, 135, 145, 155, and 165, respectively. Vias are referenced by referring to the corresponding vertical connections. In this spiral design, the vias are laid out around a center and formed a three-dimensional spiraled structure. For example, the vias corresponding to the vertical connection 140 are at the center and the vias corresponding to vertical connections 110, 120, 130, 150, 160, and 170 are laid around it.

FIG. 2 shows another prior art stretched via design 200 in a cross-sectional view on the XZ plane and a top view in the XY plane. For illustration purposes, eight layers are shown. Again there are no top and bottom layer metal connections and vias are connected directly to the C4 bump and BGA balls directly.

The cross-sectional view in the XZ plane shows vertical connections 210, 220, 230, 240, 250, 260 and 270, connecting to layers 215, 225, 235, 245, 255, and 265, respectively. Vias are referenced by referring to the corresponding vertical connections. In this stretched design, vias are restricted in the Y=0 plane and are placed along the X direction while moving to upper layers. For example, the vias corresponding to the vertical connections 270, 260, 250, 240, 230, 220, and 210 are arranged in a somewhat linear fashion moving through the layers 265, 255, 245, 235, 225, and 215 in a staircase or stretched fashion. This stretched via design has a maximum travel distance along the X direction.

Both the spiral and stretched designs shown in FIGS. 1 and 2 suffer a major drawback. The total inductance of both via design is large because most of the mutual inductances between adjacent layers are additive to the total inductance. The large total inductance reduces signal integrity in the signal paths.

Therefore there is a need to provide an efficient technique to provide a via design for the OLGA with minimum total via inductance.

SUMMARY

The present invention is a method and apparatus to minimize via inductance in a multi-layer organic land grid array (OLGA) packaging. A plurality of layers are staggered vertically. The plurality of layers include first and second layers which have first and second metal strip connections, respectively. The second layer is above the first layer. The first metal strip connection is aligned with the second metal strip connection to maximize mutual inductance between the first and second layers.

BRIEF DESCRIPTION OF THE DRAWINGS

The features and advantages of the present invention will become apparent from the following detailed description of the present invention in which.

DESCRIPTION

The present invention is a method and apparatus for reducing via inductance in multi-layer OLGA packaging.

Metal strip connections on adjacent layers are aligned in pairs. The mutual inductances are therefore increased, which in turn reduces the total inductance because the mutual inductances are subtractive to the total inductance.

In the following description, for purposes of explanation, numerous details are set forth in order to provide a thorough understanding of the present invention. However, it will be apparent to one skilled in the art that these specific details are not required in order to practice the present invention. In other instances, well known electrical structures and circuits are shown in block diagram form in order not to obscure the present invention unnecessarily.

Figure 3:
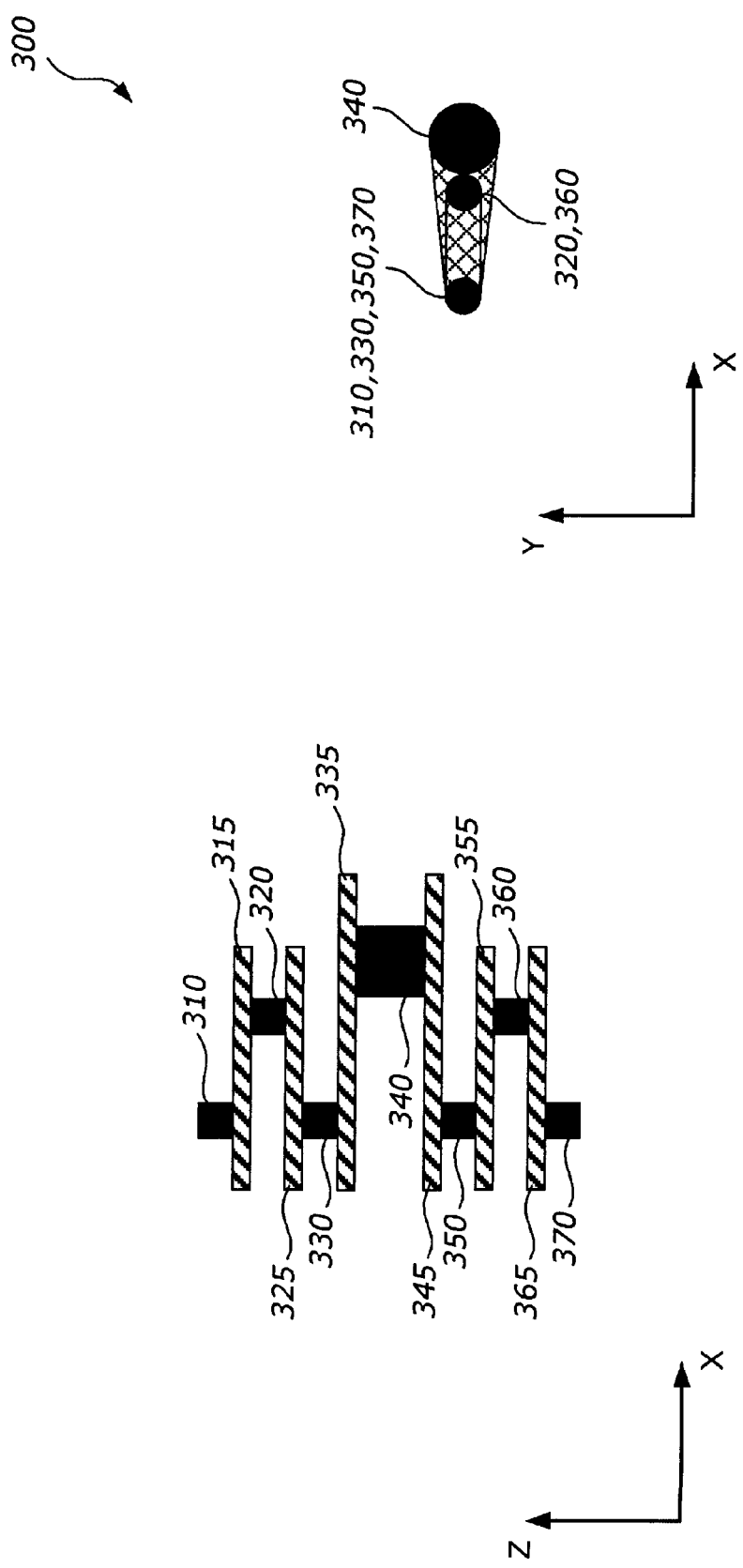
FIG. 3 is a diagram illustrating a fully aligned via design according to one embodiment of the invention.

FIG. 3 is a diagram illustrating a fully aligned via design 300 according to one embodiment of the invention. The fully aligned via design 300 is shown in a cross-sectional view on the XZ plane and a top view in the XY view. For illustration purposes, eight layers are shown. As is known by one skilled in the art, any number of layers can be used.

The cross-sectional view in the XZ plane shows vertical connections 310, 320, 330, 340, 350, 360 and 370, connecting to layers 315, 325, 335, 345, 355, and 365, respectively. Layers 315, 325, 335, 345, 355, and 365 are 3F, 2F, 1F, 1B, 2B, and 3B metal layer connections where F refers to frontside and B refers to backside. Vias are referenced by referring to the corresponding vertical connections. The vias 310, 320, 330, 350, 360, and 370 are the 3F-to-4F, 2F-to-3F, 1F-to-2F, 1B-to-2B, 2B-to-3B, and 3B-to-4B vias, respectively. The vertical connection 340 is the plated through hole (PTH) which is the core layer vertical connection. In this optimal design, vias are designed within the Y=0. Depending on the geometry, planarity in other planes is also possible. In addition, some tolerances regarding the planarity of the vias may be acceptable with sub-optimal results.

The upper-layer metal strip is laid out right on top of the metal strip in the layer below. This ensures that the metal strips between adjacent metal layers are fully aligned and therefore fully coupled electrically to each other. For example, the layers 355 and 365 are fully aligned and electrically coupled to each other. The top view shows that the layers 315, 325, 335, 345, 355, and 365 are fully aligned.

The full alignment of the two adjacent layers leads to a maximum value of mutual inductances between the two metal strip sections facing each other. Because currents on the two metal strips flow in opposite directions and have equal current magnitudes, their mutual inductances are subtractive to the total inductance.

Figures 1, 2:
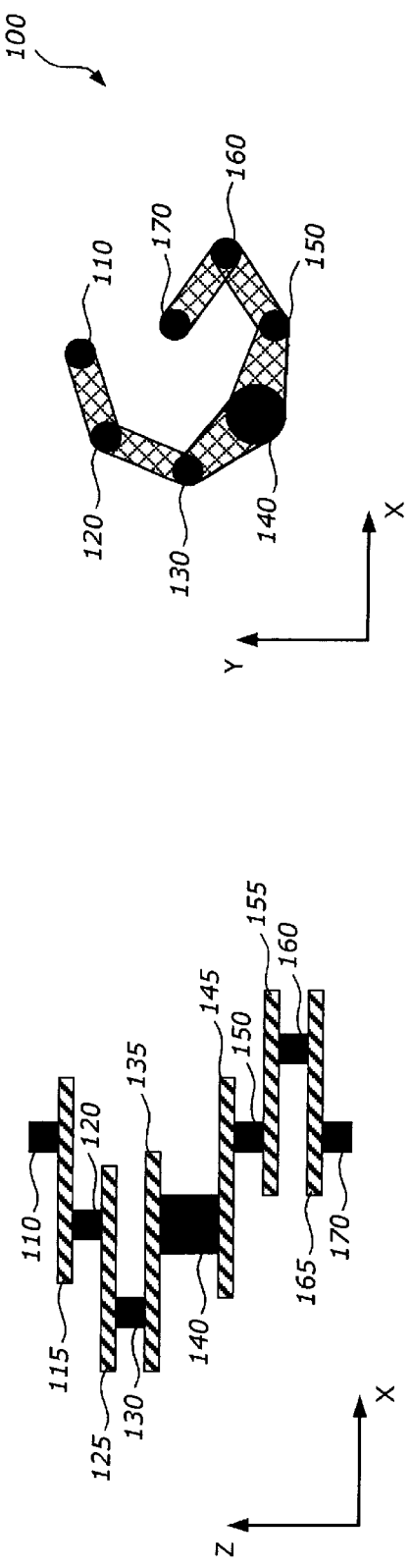
FIG. 1 is a diagram illustrating a prior art spiral via design.
FIG. 2 is a diagram illustrating a prior art stretched via design.

It should also be noted that compared to the prior art via designs in FIGS. 1 and 2, the fully aligned via design in FIG. 3 keeps the total via resistance essentially the same while the total inductance is reduced. This is because the total length of the signal traces through the vertical connections is essentially the same. The reduction of total via inductance could be as high as 40%.

Figure 4:
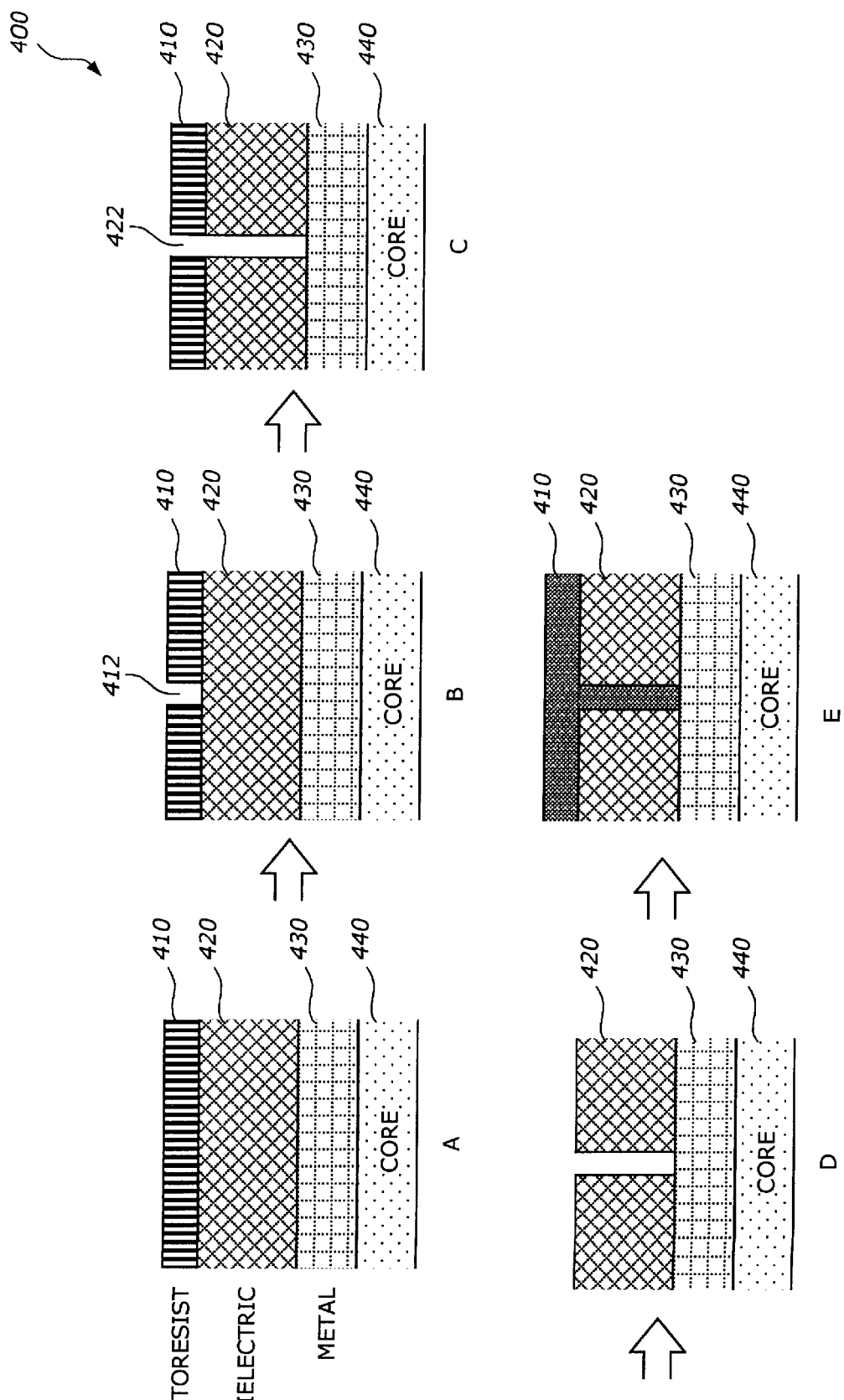
FIG. 4 is a diagram illustrating a manufacturing process of the vias according to one embodiment of the invention.

FIG. 4 is a diagram illustrating a manufacturing process 400 of the vias according to one embodiment of the invention. The process 400 includes steps A, B, C, D, and E.

The manufacturing process 400 is similar to a Silicon processing technology. In step A, a metal layer 430 is deposited on top of a core layer 440, a dielectric layer 420 is deposited on the metal layer 430, and a photoresist layer 410 is on the dielectric layer 420. The core layer 440 represents the core circuit of the integrated circuit that is to be packaged.

In step B, the photoresist patterning is performed to reveal an opening 412. In step C, wet etching is performed based on the photoresist pattern to create a via or hole 422 through the dielectric layer 420 touching the surface of the metal layer 430. In step D, the photoresist layer 410 is removed, exposing the dielectric layer 420. In step D, the metal plating is performed by depositing a metal layer 415 on the dielectric layer 420. The via 422 therefore connects the two metal layers 415 and 430.

Figure 5:
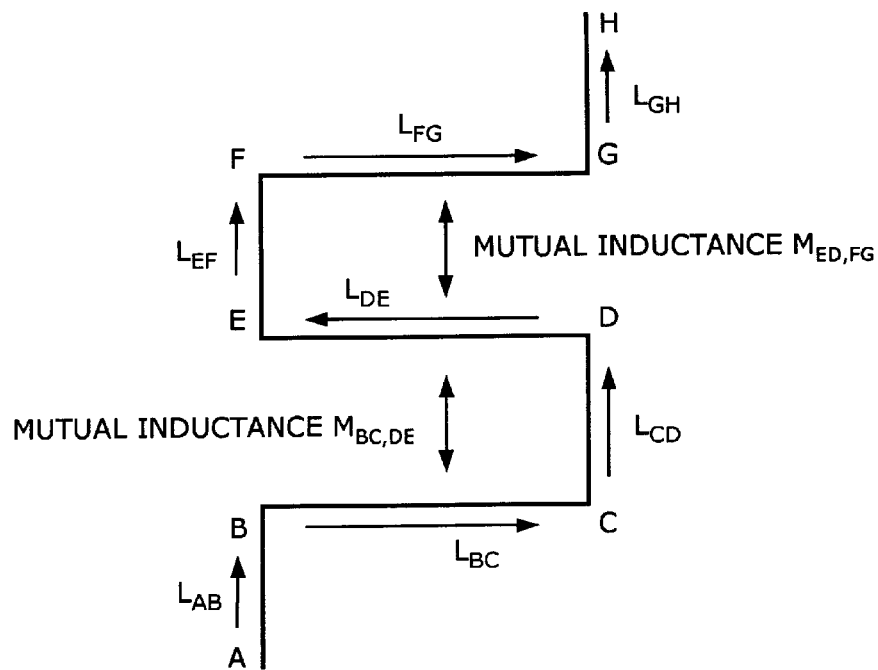
FIG. 5 is a diagram illustrating a calculation of a total inductance of the vias according to one embodiment of the invention.

FIG. 5 is a diagram illustrating a calculation of a total inductance of the vias according to one embodiment of the invention.

The diagram shows a segment of interconnection pattern including a vertical connection AB, a metal strip BC, a vertical connection CD, a metal strip DE, a vertical connection EF, a metal strip FG, and a vertical connection GH. The inductances between the end points A and B, B and C, C and D, D and E, E and F, F and G, and G and H are $L_{AB}$, $L_{BC}$, $L_{CD}$, $L_{DE}$, $L_{EF}$, $L_{FG}$, and $L_{GH}$. The mutual inductances between the metal strips BC and DE, and metal strips DE and FG are $M_{BC,DE}$ and $M_{DE,FG}$, respectively.

The total inductance $L_{total}$ is given by:

$$L_{total} = L_{AB} + L_{BC} + L_{CD} + L_{DE} + L_{EF} + L_{FG} + L_{GH} - 2M_{BC,DE} - 2M_{DE,FG} \quad (1)$$

From equation (1), $L_{total}$ is minimized when $M_{BC,DE}$ and $M_{DE,FG}$ are maximized. The mutual inductance $M_{BC,DE}$ is maximized when the metal strip BC is aligned, or right underneath the metal strip DE. Similarly, the mutual inductance $M_{DE,FG}$ is maximized when the metal strip BC is aligned, or right underneath the metal strip DE.

Figure 6:
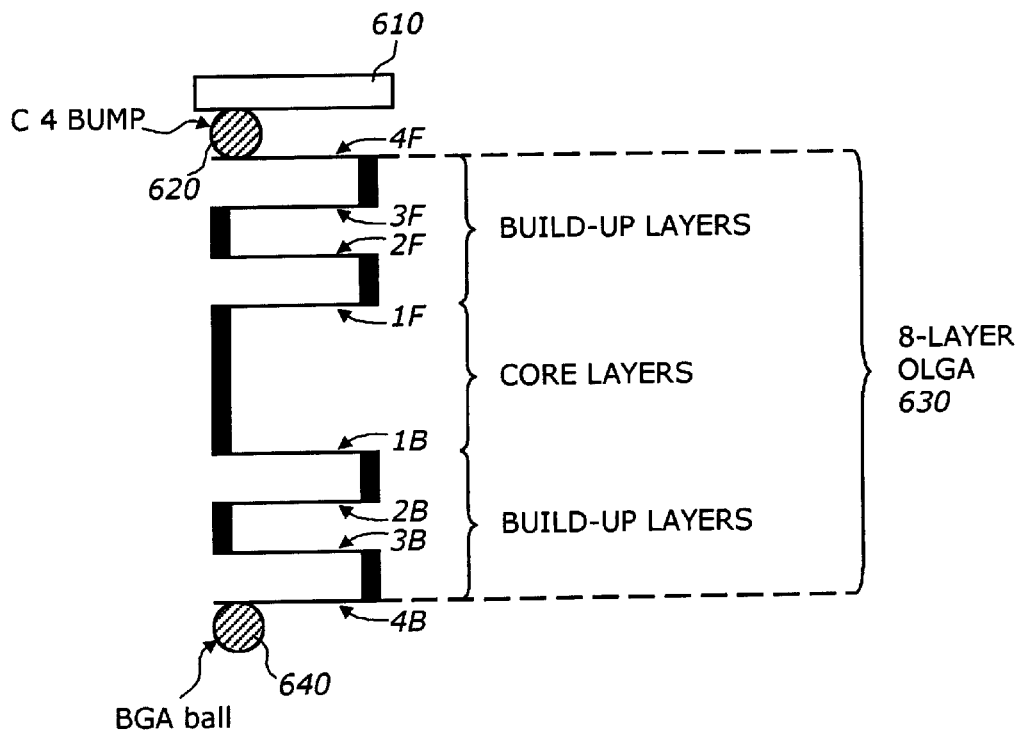
FIG. 6 is a diagram illustrating an interconnection pattern using an eight-layer OLGA according to one embodiment of the invention.

FIG. 6 is a diagram illustrating an interconnection pattern using an eight-layer OLGA according to one embodiment of the invention.

The interconnection pattern includes a silicon die 610, a C4 bump 620, an eight-layer OLGA 630, and a BGA ball 640. The 8-layer OLGA 630 includes backside layers 1B, 2B, 3B, and 4B, and front side layers 1F, 2F, 3F, and 4F. The backside layers and front side layers are two build-up layers. The core layers are between the two build-up layers.

The 8-layer OLGA is coupled directly to C4 bump 620 at the top layer 4F and the BGA ball 640 at the bottom layer 4B. As shown in FIG. 6, the metal strips of the layers are fully aligned, resulting in a lowest total inductance.

The present invention provides an efficient technique to minimize via inductance in multi-layer OLGA. The result is an improvement in signal integrity.

While this invention has been described with reference to illustrative embodiments, this description is not intended to be construed in a limiting sense. Various modifications of the illustrative embodiments, as well as other embodiments of the invention, which are apparent to persons skilled in the art to which the invention pertains are deemed to lie within the spirit and scope of the invention.

What is claimed is:

1. A method to minimize inductance in a multi-layer organic land grid array (OLGA) packaging, the method comprising:

staggering a plurality of layers vertically, the plurality of layers including first and second layers, the first and second layers having first and second metal strip connections, respectively, the second layer being above the first layer; and aligning the first metal strip connection with the second metal strip connection to maximize mutual inductance between the first and second layers.

2. The method of claim 1 wherein the plurality of layers further including a third layer having a third metal strip connection, the third layer being above the second layer.

3. The method of claim 2 further comprising:
aligning the third metal strip connection with the second metal strip connection to maximize mutual inductance between the third and second layers.

4. The method of claim 1 wherein the first and second layers are connected by a first via and the second and third layers are connected by a second via.

5. The method of claim 4 wherein the first and second vias are within a plane with respect to a three-dimensional coordinate system.

6. An organic land grid array (OLGA) package assembly comprising:
a plurality of layers which are staggered vertically, the plurality of layers including first and second layers, the first and second layers having first and second metal strip connections, respectively, the second layer being above the first layer; and
wherein the first metal strip connection is aligned with the second metal strip connection to maximize mutual inductance between the first and second layers.

7. The OLGA package assembly of claim 6 wherein the plurality of layers further comprising a third layer having a third metal strip connection, the third layer being above the second layer.

8. The OLGA package assembly of claim 7 wherein the third metal strip connection is aligned with the second metal strip connection to maximize mutual inductance between the third and second layers.

9. The OLGA package assembly of claim 6 wherein the first and second layers are connected by a first via and the second and third layers are connected by a second via.

10. The OLGA package assembly of claim 9 wherein the first and second vias are within a plane with respect to a three-dimensional coordinate system.

11. A packaged integrated circuit (IC) comprising:
an integrated circuit; and
an organic land grid array (OLGA) package assembly enclosing the integrated circuit, the OLGA package assembly comprising:
a plurality of layers which are staggered vertically, the plurality of layers including first and second layers, the first and second layers having first and second metal strip connections, respectively, the second layer being above the first layer, and
wherein the first metal strip connection is aligned with the second metal strip connection to maximize mutual inductance between the first and second layers.

12. The packaged IC of claim 11 wherein the plurality of layers further comprising a third layer having a third metal strip connection, the third layer being above the second layer.

13. The packaged IC of claim 12 wherein the third metal strip connection is aligned with the second metal strip connection to maximize mutual inductance between the third and second layers.

14. The packaged IC of claim 11 wherein the first and second layers are connected by a first via and the second and third layers are connected by a second via.

15. The packaged IC of claim 13 wherein the first and second vias are within a plane with respect to a three-dimensional coordinate system.

* * * * *